United States Patent
Hareyama

(10) Patent No.: US 6,289,208 B1
(45) Date of Patent: Sep. 11, 2001

(54) RADIO RECEIVER

(75) Inventor: Nobuo Hareyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/281,132

(22) Filed: Mar. 29, 1999

(30) Foreign Application Priority Data

Apr. 1, 1998 (JP) ................................. 10-088976

(51) Int. Cl.[7] ................................................ H04B 1/06
(52) U.S. Cl. ......................... 455/260; 455/264; 375/376
(58) Field of Search ........................ 455/257, 260, 455/264, 195.1, 256, 265, 193.1, 193.2; 375/376, 375, 371, 316; 331/27, 1 A; 327/76.23, 76.24

(56) References Cited

U.S. PATENT DOCUMENTS

| | | | |
|---|---|---|---|
| 4,205,272 | * | 5/1980 | Kumagai .............................. 455/83 |
| 5,341,402 | * | 8/1994 | Matsushita et al. .................. 375/344 |
| 5,917,315 | * | 6/1999 | Wecstrom ............................. 375/376 |
| 5,926,515 | * | 7/1999 | Park ..................................... 331/1 A |
| 6,122,493 | * | 9/2000 | Kobayashi et al. ............... 455/193.1 |
| 6,157,271 | * | 12/2000 | Black et al. ............................ 331/16 |

* cited by examiner

*Primary Examiner*—Dwayne Bost
*Assistant Examiner*—Jean A Gelin
(74) *Attorney, Agent, or Firm*—Jay H. Maioli

(57) ABSTRACT

A frequency synthesizer type receiver requiring small power consumption and maintaining excellent receiving performance. In the frequency synthesizer type receiver, a reception frequency thereof is set based on an oscillatory output of a PLL circuit. When the oscillation frequency of the PLL circuit is stabilized, a control voltage can be supplied to a voltage-controlled oscillator in the PLL circuit from a controller situated outside of the PLL circuit. The tuned state of a reception unit is measured at this time. If a shift in the reception frequency is detected based on the measured value, the control voltage to be supplied to the voltage-controlled oscillator is corrected.

1 Claim, 2 Drawing Sheets

RADIO RECEIVER

BACKGROUND OF THE INVENITON

1. Field of the Invention

The present invention relates to a receiver preferably adapted to a radio receiver or the like realized with, for example, a frequency synthesizer utilizing a phase locked loop circuit (hereinafter a PLL circuit).

2. Description of the Related Art

Conventionally, for example, a circuit shown in FIG. 1 has been developed as a receiver utilizing a frequency synthesizer based on a PLL circuit. The configuration thereof will be described below. The circuit includes a PLL circuit comprising a voltage-controlled oscillator 51 (hereinafter a VCO), a variable frequency divider 52, a reference oscillator 53, a phase detector 54, and a low-pass filter 55 (hereinafter an LPF). The VCO 51 controls the oscillation frequency of a resonant element (hereinafter a local-oscillation frequency) according to a dc value control voltage. The variable frequency divider 52 outputs a signal which is obtained by frequency-dividing the local-oscillation frequency according to an externally supplied digital value (binary value). The reference oscillator 53 produces a signal of a reference frequency. The phase detector 54 compares in phase an input signal sent from the variable frequency divider 52 with an input signal sent from the reference oscillator 53. If there is an error between the input signals, the phase 53 detector outputs an error voltage corresponding to the error. The LPF smoothes the error voltage sent from the phase detector 54 and supplies an output as a control voltage to the VCO 51. A switch 56 having a movable contact 56a and first and second stationary contacts 56b and 56c is interposed between the LPF 55 and VCO 51. The output side of the LPF 55 is connected to the first stationary contact 56b of the switch 56, and the input side of the VCO 51 is connected to the movable contact 56a thereof.

Moreover, this circuit includes a microcomputer 57 for outputting a digital value that specifies a dividing ratio for the variable frequency divider 52. The dc value control voltage supplied from the LPF 55 to the VCO 51 is converted into digital data by an analog-to-digital converter 58. The digital data is then fetched into and held in the microcomputer 57. Moreover, the microcomputer 57 is connected to a digital-to-analog converter 59. The digital-to-analog converter 59 converts the digital data output from the microcomputer 57 into a dc value control voltage. The output side of the digital-to-analog converter 59 is connected to the second stationary contact 56c of the switch 56.

An oscillation signal (local-oscillation signal) output from the VCO 51 is supplied to a reception unit 60. For example, a signal received by an antenna 61 is tuned to a frequency corresponding to the local-oscillation frequency. The tuned received signal is output through a terminal 62.

The operation of the circuit shown in FIG. 1 will be described below. To begin with, a description will be made of an operation performed when the local-oscillation frequency in the PLL circuit is fixed to a desired value. The movable contact 56a of the switch 56 is connected to the first stationary contact 56b, whereby the PLL circuit becomes a closed circuit. The microcomputer 57 sets a numerical value specifying a frequency dividing ratio so that the local-oscillation frequency will assume the desired value. Data of the numerical value is then output to the variable frequency divider 52. The variable frequency divider 52 frequency-divides the local-oscillation frequency dependent on the specified frequency dividing ratio and outputs the resulant signal to the phase detector 54. The phase detector 54 compares in phase the signal whose frequency is the fraction of the local-oscillation frequency with a reference-frequency signal output from the reference oscillator 53. If there is an error between the signals, an error voltage corresponding to the phase error is output to the LPF 55. The LPF 55 converts the input error voltage into a dc voltage. The dc voltage is supplied as a control voltage to a resonant element included in the VCO 51. The resonant element of the VCO 51 oscillates at a frequency controlled with the control voltage supplied from the LPF 55. An output is then supplied to the variable frequency divider 52 at the local-oscillation frequency. The foregoing operation of the PLL is repeated by the closed circuit until the phase error is not found by the phase detector 54. When the signal whose frequency is the fraction of the local-oscillation frequency and the reference-frequency signal output from the reference oscillator 53 becomes in phase with each other, the local-oscillation frequency is stabilized at the desired value. The reception unit 60 then receives, for example, a radio broadcast transmitted at a frequency corresponding to the stabilized local-oscillation frequency.

In the circuit shown in FIG. 1, when the operation of the PLL is stabilized, the PLL circuit is halted and the turning process is carried out. That is, when the local-oscillation frequency is stabilized, the control voltage signal output from the LPF 55 to the resonant element included in the VCO 51 is converted into digital data by the analog-to-digital converter 58. The digital data is then fetched into and held in the microcomputer 57.

When the operation of the PLL is stabilized, the movable contact 56a of the switch 56 is switched over to the second stationary contact 56c. Digital data concerning a control voltage to be supplied to the VCO 51 and held in the microcomputer 57 is output to the digital-to-analog converter 59. The digital-to-analog converter 59 converts the digital data to produce a control voltage. The control voltage is supplied to the VCO 51 via the switch 56. The oscillation frequency of the VCO 51 is controlled with the supplied control voltage and then fixed. A signal whose frequency corresponds to the oscillation frequency is received by the reception unit 60. When the movable terminal 56a of the switch 56 is connected to the stationary terminal 56c, the closed circuit of the PLL will not be realized any longer. Only part of the components including the VCO 51 and microcomputer 57 is operated, and the other equipment is halted.

Owing to the foregoing configuration, the PLL portion should be operated only when a reception frequency has been changed. After the local-oscillation frequency is fixed, the PLL portion requiring a large power consumption is halted and the tuning is carried out. The power consumption required by the receiver realized with a frequency synthesizer can thus be reduced.

In the foregoing circuit, after the PLL operation of portion is halted with digital data of a control voltage held, the read digital data of the control voltage is output unilaterally from the microcomputer, and converted into a dc voltage by the digital-to-analog converter. The VCO is thus controlled. The dc voltage to be supplied from the digital-to-analog converter may shift depending on the performances of parts and environmental capabilities concerning temperature and the like. Otherwise, the frequency at which the resonant element of the VCO is resonant may shift depending thereon. This poses a problem in that the receiving performance of the receiver deteriorates. In particular, when a received carrier wave is a shortwave, the shift emerges outstandingly and the receiving performance deteriorates markedly.

SUMMARY OF THE INVENTION

It is an object of the present invention to provide a receiver requiring a small power consumption and maintaining excellent receiving performance.

According to the present invention, there is provided a frequency synthesizer type receiver having a reception frequency thereof set based on an oscillatory output of a PLL circuit, in which a control voltage to be supplied to a voltage-controlled oscillator included in the PLL circuit is supplied from control means different from the PLL circuit. The tuned state of a reception unit is measured with the control voltage supplied. When a shift in a reception frequency is detected based on a measured value, the control voltage to be supplied to the voltage-controlled oscillator is corrected.

Specifically, under the state that the oscillation frequency of the PLL circuit is stabilized, the loop of the PLL circuit is disconnected. The control voltage is supplied from the control means to the voltage-controlled oscillator included in the PLL circuit. The reception frequency is controlled with an output of the control means. At this time, the control means judges the tuned state from a signal output from the reception unit. If a shift in the reception frequency is detected in the tuned state, the control voltage to be supplied to the voltage-controlled oscillator is corrected in order to compensate for the shift in the reception frequency.

DESCRIPTION OF THE PREFERRED EMBPDIMENT

An embodiment of the present invention will be described below with reference to FIG. 2.

Figure 1:
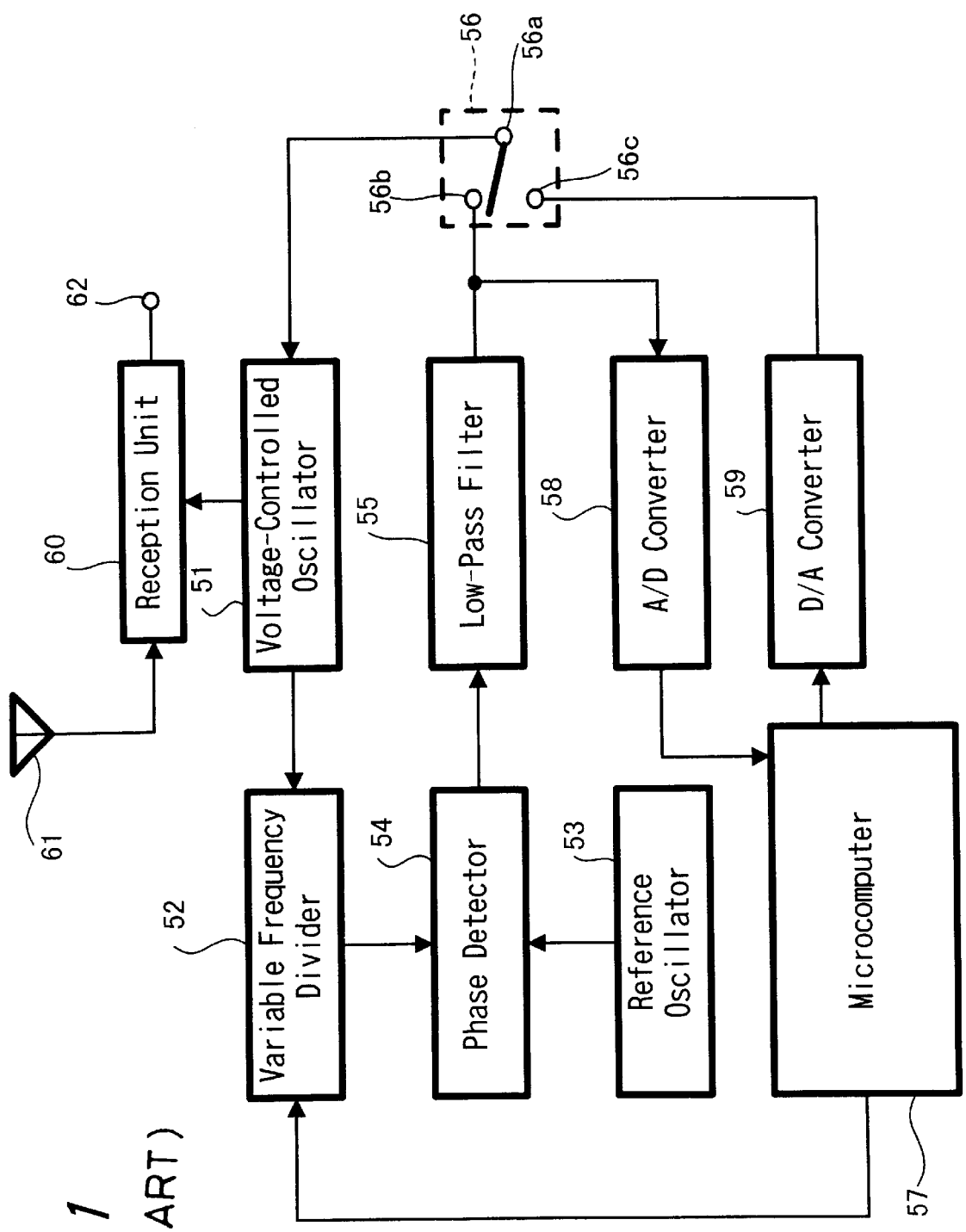
FIG. 1 is a block diagram showing an exemplary configuration of a conventional receiver.
Figure 2:
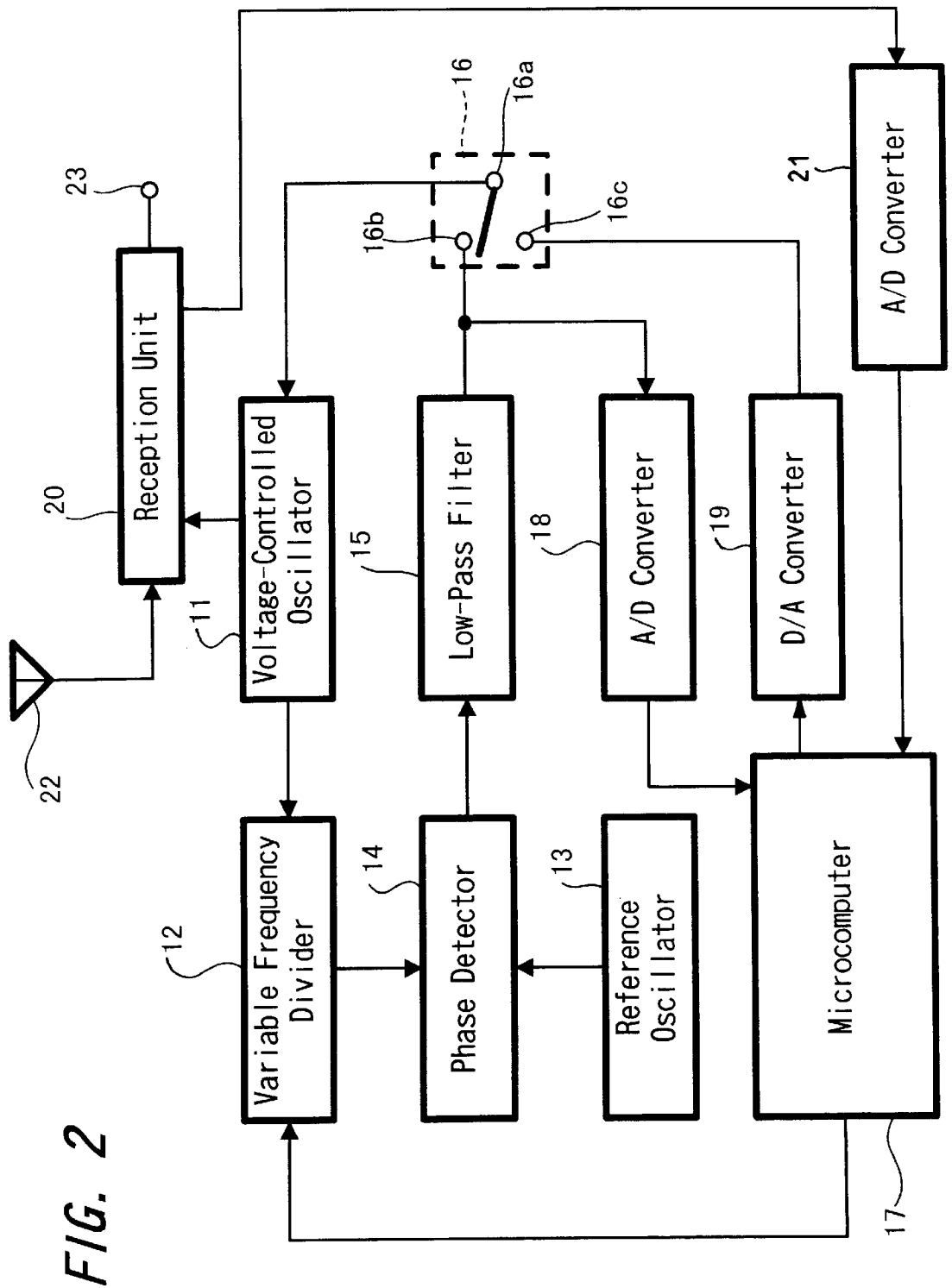
FIG. 2 is a block diagram showing an exemplary configuration in accordance with an embodiment of the present invention.

FIG. 2 is a block diagram showing the configuration of a circuit of this embodiment. The circuit of this embodiment includes a PLL circuit including a voltage-controlled oscillator 11 (hereinafter a VCO), a variable frequency divider 12, a reference oscillator 13, a phase detector 14, and a low-pass filter 15 (hereinafter an LPF). The VCO 11 controls the oscillation frequency (hereinafter a local-oscillation frequency) of its resonant element according to a dc value control voltage. The variable frequency divider 12 outputs a signal which is obtained by frequency-dividing the local-oscillation frequency dependent on, in this embodiment, an externally supplied digital value (binary value). The reference oscillator 13 produces a signal of a reference frequency. The phase detector 14 compares in phase an input signal sent from the variable frequency divider 12 with an input signal sent from the reference oscillator 13. If there is an error between the input signals, for example, the phase detector outputs an error voltage corresponding to the error. The LPF smoothes the error voltage sent from the phase detector 14 and supplies a resultant voltage as a dc value control voltage to the resonant element included in the VCO 11. In this embodiment, a switch 16 having a movable contact 16a and first and second stationary contacts 16b and 16c is interposed between the LPF 15 and the VCO 11. The output side of the LPF 15 is connected to the first stationary contact 16b of the switch 16, and the input side of the VCO 11 is connected to the movable contact 16a thereof.

Moreover, this circuit includes a microcomputer 17 for outputting a digital value that specifies a dividing ratio for the variable frequency divider 12. In this embodiment, the dc value control voltage supplied from the LPF 15 to the VCO 11 and having a predetermined output value is converted into digital data by an analog-to-digital converter 18. The microcomputer 17 fetches and holds the digital data. Moreover, the microcomputer 17 is connected to a digital-to-analog converter 19 for converting the digital data to analog data. The digital-to-analog converter 19 converts the digital data output from the microcomputer 17 into a dc value control voltage signal, and outputs the dc value control voltage signal. The output side of the digital-to-analog converter 19 is connected to the stationary terminal 16c of the switch 16.

An oscillation signal output from the VCO 11 is supplied to a reception unit 20. For example, a signal received by an antenna 22 is tuned to a frequency corresponding to the local-oscillation frequency. The tuned received signal is then output through a terminal 23. In this embodiment, a detecting circuit for detecting the received signal is incorporated in the reception unit 20. A detected signal is developed at the terminal 23. The center voltage of the detected output from the detecting circuit is converted into digital data by an analog-to-digital converter 21. The data of the center voltage of the detected output converted by the analog-to-digital converter 21 is supplied to the microcomputer 17.

Next, the operations of this circuit will be described. To begin with, a description will be made of an operation for selecting a station when the local-oscillation frequency in the PLL circuit is fixed to a desired value. In this example, upon selecting a station, the movable contact 16a of the switch 16 is connected to the first stationary contact 16b, whereby the PLL circuit becomes a closed circuit. For example, when a desired reception frequency is designated by using an operation unit that is not shown, the microcomputer 17 sets a numerical value specifying a dividing ratio so that the local-oscillation frequency will assume the desired value. Data of the numerical value is then output to the variable frequency divider 12. The variable frequency divider 12 frequency-divides the local-oscillation frequency dependent on the specified dividing ratio and outputs the resultant signal to the phase detection 14. The phase detector 14 compares in phase the signal whose frequency is the fraction of the local-oscillation frequency with a reference-frequency signal output from the reference oscillator 13. The phase detector then outputs an error voltage corresponding to a phase error and supplies the same to the LPF 15. The LPF 15 supplies a control voltage, which is a dc voltage corresponding to the input error voltage, to the VCO 11. The resonant element included in the VCO 11 oscillates at a frequency controlled with the control voltage supplied from the LPF 15, and outputs a signal of the local-oscillation frequency to the variable frequency divider 12. The foregoing operation of the PLL that is a closed circuit is repeated until the phase error is not detected by the phase detector 14. When the signal whose frequency is the fraction of the local-oscillation frequency becomes in phase with the reference-frequency signal output from the reference oscillator 13, the local-oscillation frequency is stabilized at the desired value.

The fact that the oscillation frequency of the PLL circuit is stabilized is judged by the microcomputer 17 or, for example, the state of digital data converted by the analogto-digital converter 18 is judged by the microcomputer 17. When the PLL circuit is stabilized, the microcomputer 17 fetches digital data (data of a control voltage to be supplied to the VCO 11) converted by the analog-to-digital converter 18, and holds the data.

Under the control of the microcomputer 17, the movable contact 16a of the switch 16 is switched over from the first stationary contact 16b to the second stationary contact 16c. Digital data concerning a control voltage to be supplied to the VCO 11 when the local-oscillation frequency is fixed is supplied from the microcomputer 17 to the digital-to-analog converter 19. The digital-to-analog converter 19 converts the digital data to produce a control voltage. The control voltage is supplied to the VCO 11 via the switch 16. The VCO 11 having received the supply of the control voltage is controlled with the control voltage. The VCO 11 oscillates at the same frequency as the frequency at which the PLL circuit is stabilized. A signal whose frequency corresponds to the local-oscillation frequency is received by the reception unit 20. When the movable contact 16a of the switch 16 is connected to the second stationary contact 16c, the frequency divider 12, the reference oscillator 13, and the phase detector 14 constituting the PLL circuit are halted in operation under, for example, the control of the microcomputer 17.

In this embodiment, when the oscillation frequency of the VCO 11 is controlled based on an output of the digital-to-analog converter 19, a control voltage to be supplied to the VCO 11 is corrected. This correction operation is achieved as described below. Specifically, the microcomputer 17 reads data converted by the analog-to-digital converter 21, judges from a variation in the data whether the reception frequency has shifted. Data of a voltage to be supplied to the digital-to-analog converter 19 is corrected in order to correct the judged frequency shift. The oscillation frequency of the VCO 11 is thus corrected, whereby the reception frequency of the reception unit 20 is corrected.

According to the configuration of this embodiment, data to be converted by the analog-to-digital converter 21 is data of a center voltage of a detected output from the detecting circuit in the reception unit 20. A frequency variation in a received signal is detected as a variation in the center voltage. The microcomputer 17 judges from the variation in the center voltage whether the received signal has undergone the frequency shift. The microcomputer 17 checks the center voltage at intervals of a predetermined time (for example, a time of about 3 to 10 min). The microcomputer 17 calculates a difference from a voltage value checked first. Data to be supplied from the microcomputer 17 to the digital-to-analog converter 19 is set in order to correct the frequency variation equivalent to the difference. In this case, the time at intervals of which data of the center voltage is fetched should be as long as possible but not so long as to affect the performance of power saving.

Owing to the foregoing configuration, the PLL circuit requiring a large power consumption should be operated merely upon changing a reception frequency. Normally, the VCO 11 and microcomputer 17 alone are operated for tuning the reception unit 20. The power consumption can therefore be reduced drastically. Due to a change in the performance of a part or a change in an environmental condition such as a temperature and the like, when the PLL circuit is halted, a control voltage to be supplied from the digital-to-analog converter 21 may shift. Otherwise, the reception frequency may vary because of a frequency shift in the resonant element itself included in the VCO 11. Nevertheless, the PLL circuit need not be operated. The frequency of a signal received by the reception unit 20 can be measured and a shift in the reception frequency can be corrected. Deterioration in receiving performance can thus be prevented. Reception can therefore be achieved successfully. A spectacular effect will be exerted in, especially, receiving a shortwave suffering from a terrible frequency shift.

In the foregoing embodiment, a variation in the center voltage of a detected output from the detecting circuit in the reception unit 20 is detected for detecting a shift in the reception frequency with the PLL circuit halted. The shift in the reception frequency may be detected based on the state of any other signal as long as the signal is an output signal whose state varies with a variation in a tuned frequency in the reception unit. For example, the shift in the reception frequency may be detected based on the state of an intermediate-frequency signal converted in the reception unit 20 (shift from the intermediate frequency or the like).

In the aforesaid embodiment, the analog-to-digital converter 21 for detecting data of the center voltage of the detected signal is included as a means for measuring a tuned frequency. The analog-to-digital converter 18 for detecting a control voltage to be supplied to the PLL circuit may be used instead of the analog-to-digital converter 21 to detect data of the center voltage of the detected signal. The converter 18 may thus be used selectively for detecting the control voltage to be supplied to the PLL circuit and for detecting the center voltage of the detected output. In this case, switching a voltage to be detected by the converter 18 from one to another is conceivably controlled by the microcomputer 17 responsively to, for example, switching of the switch 16. Consequently, the number of analog-to-digital converters can be decreased by one compared with the configuration shown in FIG. 2.

Moreover, in the aforesaid embodiment, the present invention is adapted to a radio receiver in which the reception unit 20 receives radio broadcast waves. Needless to say, the present invention can be adapted to receivers for receiving other broadcast waves or transmitted signals other than the broadcast waves.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A receiver, comprising:
 a phase-locked loop circuit including a voltage-controlled oscillator, a variable frequency divider for frequency-dividing an output of said voltage-controlled oscillator, a reference oscillator, a phase detector for outputting a phase difference signal representing a phase difference between an output of said variable frequency divider and an output of said reference oscillator, and a filter for smoothing an output voltage of said phase detector, with a resultant voltage of said filter used as a control voltage fed to said voltage-controlled oscillator;

a reception unit, tuned to a frequency corresponding to an oscillation frequency of said voltage-controlled oscillator, for receiving a signal having the oscillation frequency of said voltage-controlled oscillator;

control voltage measuring means for measuring the control voltage supplied to said voltage-controlled oscillator and for measuring a voltage of an output signal of said reception unit that corresponds to the tuned frequency of said reception unit; and control means for producing a signal that has a voltage value measured by said control voltage measuring means and supplying the signal to said voltage-controlled oscillator when the oscillation frequency of said phase-locked loop circuit is stabilized and said phased-locked loop is open, wherein said control means further controls said control voltage measuring means to measure a center voltage of the output signal from said reception unit for correcting the voltage value of the produced signal according to a frequency shift when a shift in the tuned frequency of said reception unit is detected by comparing the measured center voltage to an initial center voltage measured when said phase-locked loop circuit is first stabilized.

* * * * *